(12) United States Patent
Park et al.

(10) Patent No.: US 12,176,013 B2
(45) Date of Patent: Dec. 24, 2024

(54) EXTENDED CENTER STIFFENER PLATE FOR IMPROVED STRUCTURAL DYNAMICS OF ACTUATORS IN A MULTI-ACTUATOR HARD DISK DRIVE

(71) Applicant: Western Digital Technologies, Inc., San Jose, CA (US)

(72) Inventors: Jung-Seo Park, San Jose, CA (US); Siddhesh Vivek Sakhalkar, Milpitas, CA (US); Arman V. Golgolab, Los Altos, CA (US); Fred Golinveaux, Danville, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/224,423

(22) Filed: Jul. 20, 2023

(65) Prior Publication Data

US 2024/0274159 A1 Aug. 15, 2024

Related U.S. Application Data

(60) Provisional application No. 63/445,523, filed on Feb. 14, 2023.

(51) Int. Cl.
*G11B 5/55* (2006.01)
*G11B 5/48* (2006.01)
(Continued)

(52) U.S. Cl.
CPC .......... *G11B 5/5573* (2013.01); *G11B 5/4813* (2013.01); *G11B 5/5521* (2013.01); *G11B 5/5578* (2013.01); *G11B 25/043* (2013.01); *G11B 5/54* (2013.01); *G11B 33/022* (2013.01); *G11B 33/122* (2013.01); *G11B 2220/2516* (2013.01); *H05K 1/118* (2013.01)

(58) Field of Classification Search
None
See application file for complete search history.

(56) References Cited

U.S. PATENT DOCUMENTS

| 4,544,972 A | 10/1985 | Kogure et al. |
|---|---|---|
| 4,819,110 A | 4/1989 | Funai et al. |

(Continued)

FOREIGN PATENT DOCUMENTS

WO WO2010107395 A1 9/2010

OTHER PUBLICATIONS

Anonymous, Dual Actuator tuned mass damper pivot bearing, ip.com, Feb. 1, 2000, 1 page, ip.com disclosure No. IPCOM000013589D, IBM, US.

(Continued)

*Primary Examiner* — Craig A. Renner
(74) *Attorney, Agent, or Firm* — John D. Henkhaus

(57) ABSTRACT

A multi-actuator hard disk drive includes a lower actuator with a corresponding voice coil motor assembly (VCMA), a coaxial upper actuator with a corresponding VCMA, and a central extended stiffener plate positioned between the upper and lower VCMAs and extending beyond the pivot area at least to an area adjacent to the disk stack. Use of an extended stiffener plate enables some control over the direct and coupled plant transfer functions, while effectively providing a base support structure for the upper VCMA and cover support structure for the lower VCMA.

20 Claims, 16 Drawing Sheets

(51) Int. Cl.
*G11B 25/04* (2006.01)
*G11B 5/54* (2006.01)
*G11B 33/02* (2006.01)
*G11B 33/12* (2006.01)
*H05K 1/11* (2006.01)

(56) References Cited

U.S. PATENT DOCUMENTS

| | | | |
|---|---|---|---|
| 5,223,993 | A | 6/1993 | Squires et al. |
| 5,315,467 | A | 5/1994 | Yoshida |
| 6,005,743 | A | 12/1999 | Price et al. |
| 6,034,834 | A | 3/2000 | Yoshikawa et al. |
| 6,121,742 | A | 9/2000 | Misso |
| 6,449,130 | B1 | 9/2002 | Koyama |
| 6,490,138 | B1 | 12/2002 | Prater |
| 6,560,075 | B2 | 5/2003 | Price et al. |
| 6,563,657 | B1 | 5/2003 | Serrano et al. |
| 6,687,092 | B2 | 2/2004 | Kan et al. |
| 7,222,410 | B1 | 5/2007 | Klassen et al. |
| 8,570,682 | B2 | 10/2013 | Ichikawa et al. |
| 9,263,094 | B2 | 2/2016 | Haidari |
| 10,186,286 | B2 | 1/2019 | Keshavan |
| 10,276,194 | B2 | 4/2019 | Keshavan et al. |
| 10,891,980 | B1 | 1/2021 | Keshavan et al. |
| 11,456,009 | B1 | 9/2022 | Liu |
| 2002/0149884 | A1 | 10/2002 | Price et al. |
| 2006/0202565 | A1 | 9/2006 | Ogawa |
| 2022/0406332 | A1 | 12/2022 | Ma et al. |
| 2024/0038262 | A1* | 2/2024 | Park et al. ........... G11B 5/5573 |
| 2024/0105222 | A1* | 3/2024 | Park et al. ........... G11B 5/5573 |

OTHER PUBLICATIONS

Anton Shilov, Seagate's Multi Actuator Technology to Address HDD IOPS Woes, AnandTech, Dec. 29, 2017, 6 pages, downloaded from https://www.anandtech.com/show/12169/seagates-multi-actuator-technology-to-double-hdd-performance.

Cobb, Mike, Seagate Multi Actuator Technology: Data Recovery, Michael Collins DriveSavers Blog, Jan. 25, 2018, 8 pages, DriveSavers Data Recovery, downloaded at https://drivesaversdatarecovery.com/seagate-multi-actuator-technology-data-recovery/.

Zheng, Jinchuan et al., Feedforward Decoupling Control Design for Dual-Actuator System in Hard Disk Drives, IEEE Transactions on Magnetics, Jul. 2004 (Manuscript), pp. 2080-2082, vol. 40, No. 4.

Shah, Prateek et al., Active Vibration Rejection in Multi Actuator Drives: Data Driven Approach (Abstract), Conference: ASME 2019 Dynamic Systems and Control Conference, Oct. 2019, 1 page, downloaded at https://www.researchgate.net/publication/337550057_Active_Vibration_Rejection_in_Multi_Actuator_Drives_Data_Driven_Approach.

* cited by examiner

POSITION, WITHIN AN ENCLOSURE BASE OF A HARD DISK DRIVE AND AROUND A PIVOT, A LOWER ROTARY ACTUATOR COMPRISING A LOWER VOICE COIL MOTOR ASSEMBLY (VCMA)
602

POSITION A STIFFENER PLATE ONTO THE LOWER VCMA, WHEREIN THE STIFFENER PLATE EXTENDS BEYOND THE PIVOT AT LEAST TO AN AREA IMMEDIATELY ADJACENT TO A DISK MEDIA STACK
604

POSITION, ONTO THE STIFFENER PLATE AND AROUND THE PIVOT, AN UPPER ROTARY ACTUATOR COMPRISING AN UPPER VOICE COIL MOTOR ASSEMBLY (VCMA)
606

ATTACH THE STIFFENER PLATE TO THE ENCLOSURE BASE BY INSERTING A RESPECTIVE FASTENER AT EACH OF A PLURALITY OF LOCATIONS
608

FIG. 6

EXTENDED CENTER STIFFENER PLATE FOR IMPROVED STRUCTURAL DYNAMICS OF ACTUATORS IN A MULTI-ACTUATOR HARD DISK DRIVE

FIELD OF EMBODIMENTS

Embodiments of the invention may relate generally to data storage devices such as hard disk drives and particularly to approaches for improving the structural dynamics of the actuators in a multi-actuator hard disk drive.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write transducer (or read-write "head") that is positioned over a specific location of a disk by an actuator. A read-write head makes use of magnetic fields to write data to, and read data from, the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

Increasing areal density (a measure of the quantity of information bits that can be stored on a given area of disk surface) is one of the on-going goals of hard disk drive technology evolution. However, in recent years the growth in areal density in HDDs has not kept pace with the trends of years past. This has shifted the burden on the mechanics to boost capacity increases by increasing the number of disks within the prescribed form factor. In one form, this goal manifests in the type of high-capacity HDDs that are especially attractive in the context of enterprise, cloud computing/storage, and data center environments. However, the performance of high-capacity HDDs has not necessarily scaled up commensurately with the increases in capacity. The high latencies of large capacity HDDs in a clustered environment, such as in data centers with multiple clustered nodes, limits their appeal due to slower access to stored data. As these HDDs are primarily used for near line storage in data centers in hyper-scale environments, the performance of these high-capacity drives also has to satisfy the IOPs (Input/Output Operations Per Second) density requirements (in some instances, similarly referred to as IOPs/TB) to minimize latency. This has led to the need to develop and implement various means to increase high-capacity HDD performance.

One approach to increasing high-capacity HDD performance is the implementation of multi-actuator systems, in which multiple independently operating actuators are assembled onto a single shared pivot shaft in order to independently and concurrently read from and/or write to multiple recording disks of a disk stack. However, the operation of multiple actuators on a shared pivot shaft structurally couples the vibration modes of the independently operating actuators, leading to the transfer of vibrational energy between actuators systems by way of the shared shaft. That is, operation (i.e., rotary movement) of one actuator generates forces that transfer via the shared shaft to the other actuator(s). This vibration transferred to the other actuator(s) affects the ability of the corresponding read-write transducer (or "head") to efficiently arrive at and to stay on-track, resulting in excessive track mis-registration ("TMR"). TMR limits the performance of HDDs in that an inordinate amount of time is expended trying to position and maintain the head well-centered over a data track (e.g., via servoing). The corresponding read and write operations are effectively delayed as a result, thus reducing overall I/O performance.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 6 is a flowchart illustrating a method of assembling a multi-actuator assembly in a hard disk drive, according to an embodiment.

DETAILED DESCRIPTION

Figure 1:
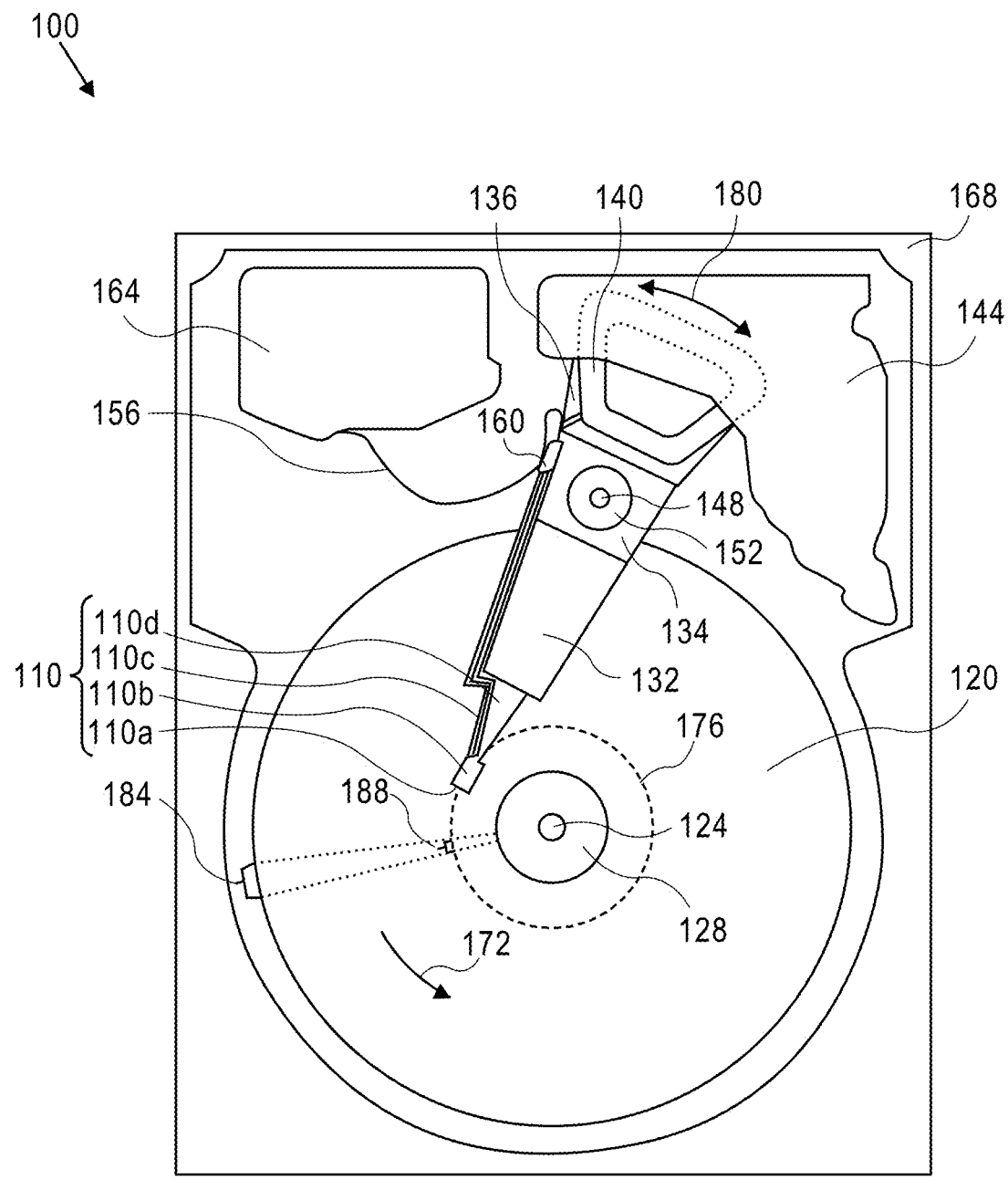
FIG. 1 is a plan view illustrating a hard disk drive (HDD), according to an embodiment.

Generally, approaches to improving the structural dynamics of an actuator system in a multi-actuator hard disk drive are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Recall that in recent history the performance of high-capacity hard disk drives (HDDs) has not necessarily scaled up commensurately with increases in storage capacity, whereby an IOPS/TB (referred to as "IOPS density", where "IOPS" refers to input/output per second) deficit could stand in the way of widespread adoption of such HDDs. This challenge has led to pursuit of multi-actuator systems.

In a multi-actuator HDD, the dynamics of the actuators are strongly coupled. This means that exciting one actuator (by way of seeking) causes resonance modes on the other actuator(s) to be excited as well. The adverse effects of structural dynamics coupling between the actuators in a multi-actuator HDD can be mitigated by providing a laterally stiff interface (i.e., a center plate) between the opposing pivot shafts of the actuator-pivot assemblies. For example, a supporting centerplate may be sandwiched between the VCMAs (voice coil motor assemblies) and the pivot shafts without any direct attachment to the base, i.e., without the centerplate and base being in direct contact at an attachment location. One approach to a sandwiched central support structure is described and illustrated in U.S. Pat. No. 10,891, 980 B1 to Keshavan et al., entitled "Central Support For Improved Structural Dynamics Of Actuators In A Multi-Actuator Hard Disk Drive", the entire content of which is incorporated by reference for all purposes as if fully set forth herein.

Figure 2:
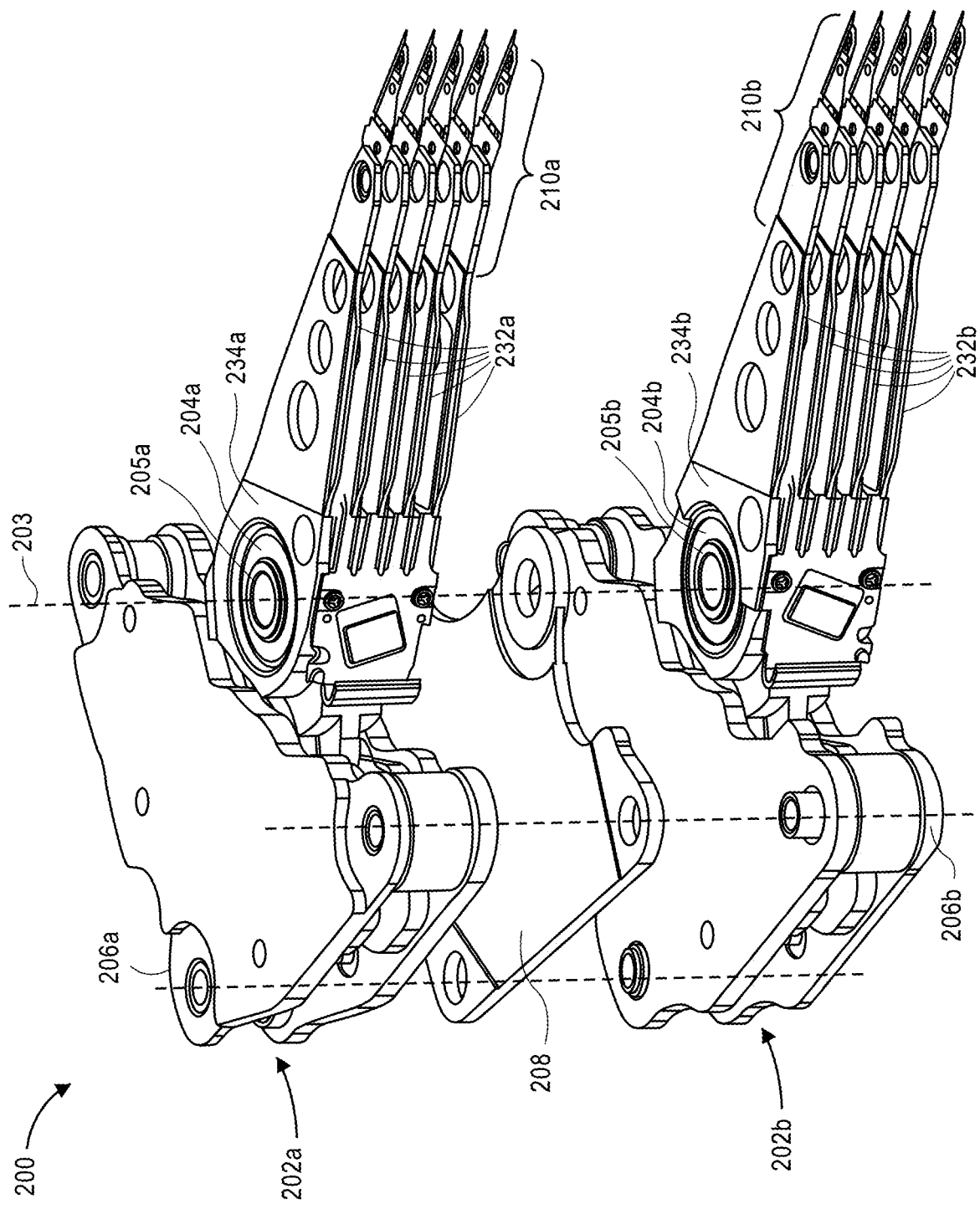
FIG. 2 is an exploded perspective view illustrating a multi-actuator assembly with a central support structure.

FIG. 2 is an exploded perspective view illustrating a multi-actuator assembly with a central support structure. Here, a hard disk drive comprises a multi-actuator assembly 200 comprising two (for purposes of a non-limiting example) independent actuator systems 202a, 202b which can be independently optimized, sharing the same rotational axis 203 and capable of concurrently servicing a respective disk stack (see, e.g., a stack of multiple recording media 120 of FIG. 1). Each of the two actuator systems 202a, 202b comprises its own respective pivot bearing assembly 204a, 204b (see, e.g., pivot bearing assembly 152 of FIG. 1), and are physically separate from each other. Each actuator system 202a, 202b also comprises its own voice coil motor assembly (VCMA) 206a, 206b. The two actuator systems 202a, 202b are stacked on top of each other in a modular fashion, with each of the two pivot shafts 205a, 205b (see, e.g., pivot shaft 148 of FIG. 1) engaging a common post (not shown here) that is integrated with an enclosure base (e.g., HDD housing 168 of FIG. 1). Similar to FIG. 1, each actuator system 202a, 202b further comprises a respective voice coil (not visible here; see, e.g., voice coil 140 of FIG. 1), carriage 234a, 234b (see, e.g., carriage 134 of FIG. 1), set or comb of arms 232a, 232b (see, e.g., arm 132 of FIG. 1) coupled therewith, and a set of HGAs 210a, 210b (see, e.g., HGA 110 of FIG. 1) coupled therewith. Note that the number of actuators that may be assembled into an HDD may vary from implementation to implementation; however, an exemplary but non-limiting dual-actuator arrangement is described throughout herein.

The dynamics of a multi-actuator HDD is characterized by its direct and coupled plant transfer functions. While the direct plant transfer function describes the response of an actuator system to its own actuation, the coupled plant transfer function characterizes the response of the secondary actuator(s) system to actuation of the primary actuator system. Here, a central support structure 208 (or "support plate" or "centerplate") is sandwiched between the pivot shafts 205a, 205b and between the pole pieces of the upper and lower VCMAs 206a, 206b of the two actuator-pivot assemblies, which provides a high sway (lateral) stiffness interface to overcome the degradation in tilt and in-phase butterfly modes associated with a multi-actuator system. Thus, the adverse effects of structural dynamics coupling between the actuator systems 202a, 202b are mitigated by providing this laterally stiff interface corresponding to the central support structure 208, which increases the frequencies of key structural modes such as tilt and in-phase butterfly modes while also reducing the gains of lower frequency modes such as coil torsion.

Figure 3:
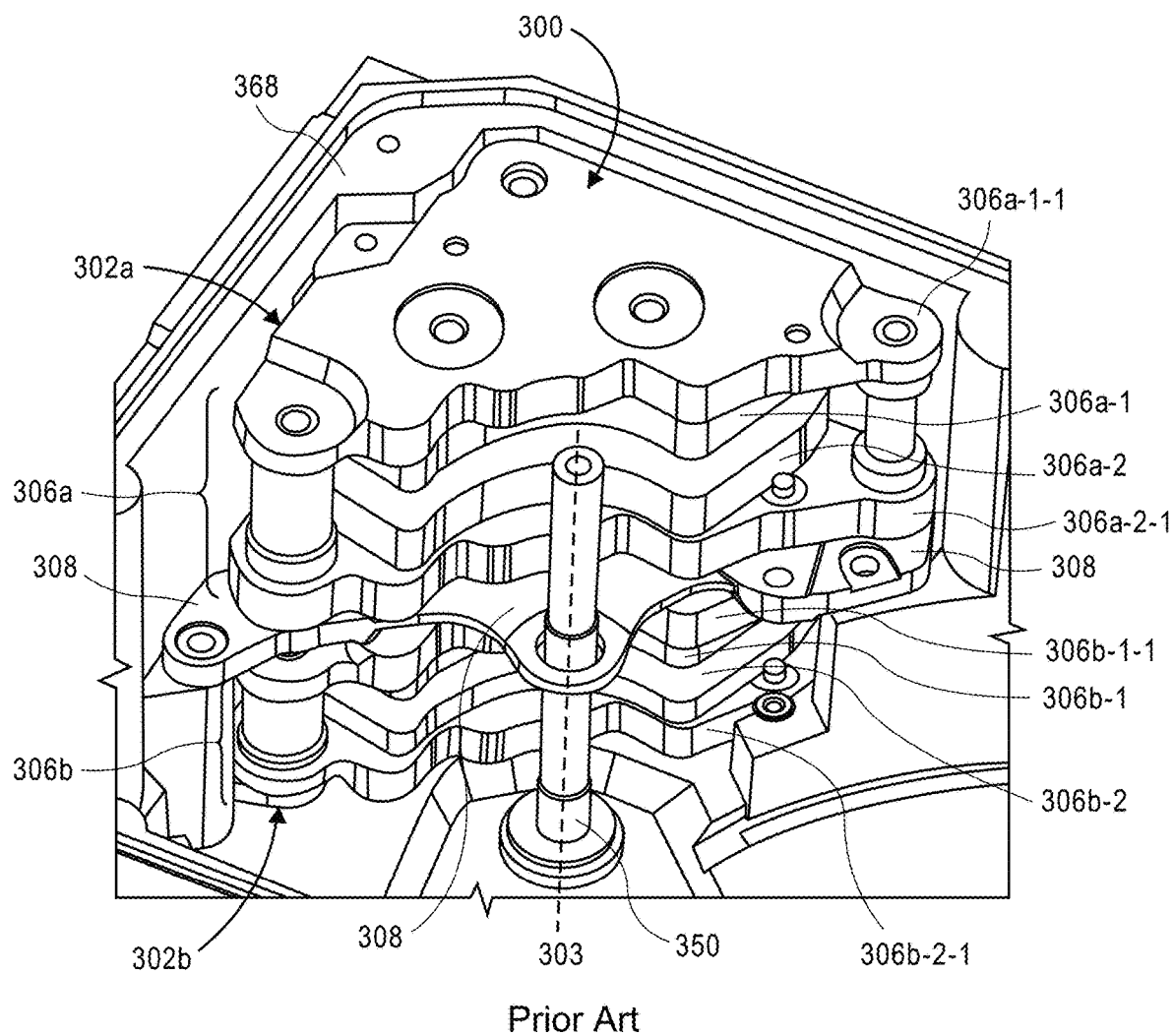
FIG. 3 is a perspective view illustrating a multi-actuator system with a limited centerplate, according to an embodiment.

FIG. 3 is a perspective view illustrating a multi-actuator system with a limited centerplate, according to an embodiment. A hard disk drive comprises a multi-actuator assembly 300 comprising two (for purposes of a non-limiting example) independent actuator systems 302a, 302b, where the coils (see, e.g., voice coil 140 of FIG. 1), carriages (see, e.g., carriage 134 of FIG. 1), arms (see, e.g., arm 132 of FIG. 1), HSAs (see, e.g., description corresponding to FIG. 1), HGAs (see, e.g., HGA 110 of FIG. 1), etc. are omitted here for clarity but are configured similarly as with actuator systems 202a, 202b (FIG. 2). Here, the top (upper) and bottom (lower) actuator systems 302a, 302b may be implemented with more arms 232a, 232b (FIG. 2; see also, e.g., arm 132 of FIG. 1) and thus a larger set of HGAs 210a, 210b

(FIG. 2; see also, e.g., HGA 110 of FIG. 1) coupled therewith, than with the actuator systems 202a, 202b, sharing the same rotational axis 303 and capable of concurrently servicing a respective set of disk media (see, e.g., a stack of multiple recording media 120 of FIG. 1).

Each of the two actuator systems 302a, 302b may comprise its own respective pivot bearing assembly (see, e.g., pivot bearing assembly 204a, 204b of FIG. 2, pivot bearing assembly 152 of FIG. 1), and are physically separate from each other. Each actuator system 302a, 302b also comprises its own voice coil motor assembly (VCMA) 306a, 306b, which each comprises at least one magnet 306a-1, 306a-2, 306b-1, 306b-2 coupled with a respective magnet housing plate 306a-1-1, 306a-2-1, 306b-1-1, 306b-2-1, where a respective voice coil of each actuator (not shown here; see, e.g., voice coil 140 of FIG. 1) is positioned between the corresponding magnets 306a-1, 306a-2, 306b-1, 306b-2 to form a voice coil motor/actuator. The two actuator systems 302a, 302b are stacked on top of each other in a modular fashion, with each of two pivot shafts (not shown here; see, e.g., pivot shaft 205a, 205b of FIG. 2, pivot shaft 148 of FIG. 1) engaging a common post 350 that is integrated with an enclosure base 368 (e.g., HDD housing 168 of FIG. 1). Similar to FIGS. 1-2, each actuator system 302a, 302b further comprises a respective carriage (not shown here; see, e.g., carriage 234a, 234b of FIG. 2, carriage 134 of FIG. 1), a set or comb of arms (not shown here; see, e.g., arm 232a, 232b of FIG. 2, arm 132 of FIG. 1) coupled therewith, and a set of HGAs (not shown here; see, e.g., HGAs 210a, 210b of FIG. 2, HGA 110 of FIG. 1) coupled therewith.

According to an embodiment a centerplate 308 is positioned between a bottom magnet housing plate 306a-2-1 of top VCMA 306a and a top magnet housing plate 306b-1-1 of bottom VCMA 306b and preferably fastened to the enclosure base 368. Direct attachment of the centerplate 308 to the base 368 (and/or to VCM plates) through one or more mechanical fastener (e.g., screws) mitigates critical actuator dynamics issues in multiple actuator HDDs by restraining a tilting/rocking motion of the centerplate and, thereby, the VCMAs and HSAs. Hence, a clean direct plant transfer function with minimal low frequency peaks (prior to the first butterfly system mode) is enabled, thereby further enabling a robust servo-controller design. Furthermore, direct attachment in the form of mechanical fastening of the centerplate 308 leads to a significant reduction in the coupled plant transfer function gain at low frequencies (again, prior to the first butterfly system mode), including in excess of a 10 dB (decibel) peak-to-peak gain reduction in the coil torsion mode. This is likely to enable a beneficially lower cPES (coupled Position Error Signal) response.

While the forgoing configurations may work well for 1" (one-inch height) HDDs, they would not be expected to work as well for 2" (two-inch height) HDDs, which have heavier and taller (e.g., effectively doubled) VCMAs, actuators, base walls, and base posts compared to 1" HDDs. This introduces significantly more compliance into the multi-actuator system, mainly due to different boundary conditions of the multi-actuators as compared to a single actuator. For example, due to significantly lower enclosure stiffness, the frequency response function (FRF) of a typical 2" multi-actuator HDD looks much worse than the FRF of a typical 1" single actuator HDD. For example, modeling shows that the direct plant transfer function of a typical 2" HDD including a sandwiched centerplate shows multiple low frequency peaks in the tilt mode (involving tilting/rocking motion of pivots, VCMAs, and the enclosure) and the first butterfly (BF1) system modes (which may also be referred to as the main mechanical system mode or the first principal bending mode of the actuator), with high gain and a large head-to-head variation, as well as multiple dips in BF1 phase roll-off. The coupled plant transfer function of a typical 2" HDD also shows these high-gain low-frequency peaks in the coil torsion mode, which can also result in a high cPES (coupled Position Error Signal) response. Thus, challenges remain regarding controlling, managing, mitigating these high-gain low-frequency modes that are either excited directly by the primary actuator or are coupled with the secondary actuator.

Multi-Actuator System Having "Internal Cover" Between Actuators

Figure 4A:
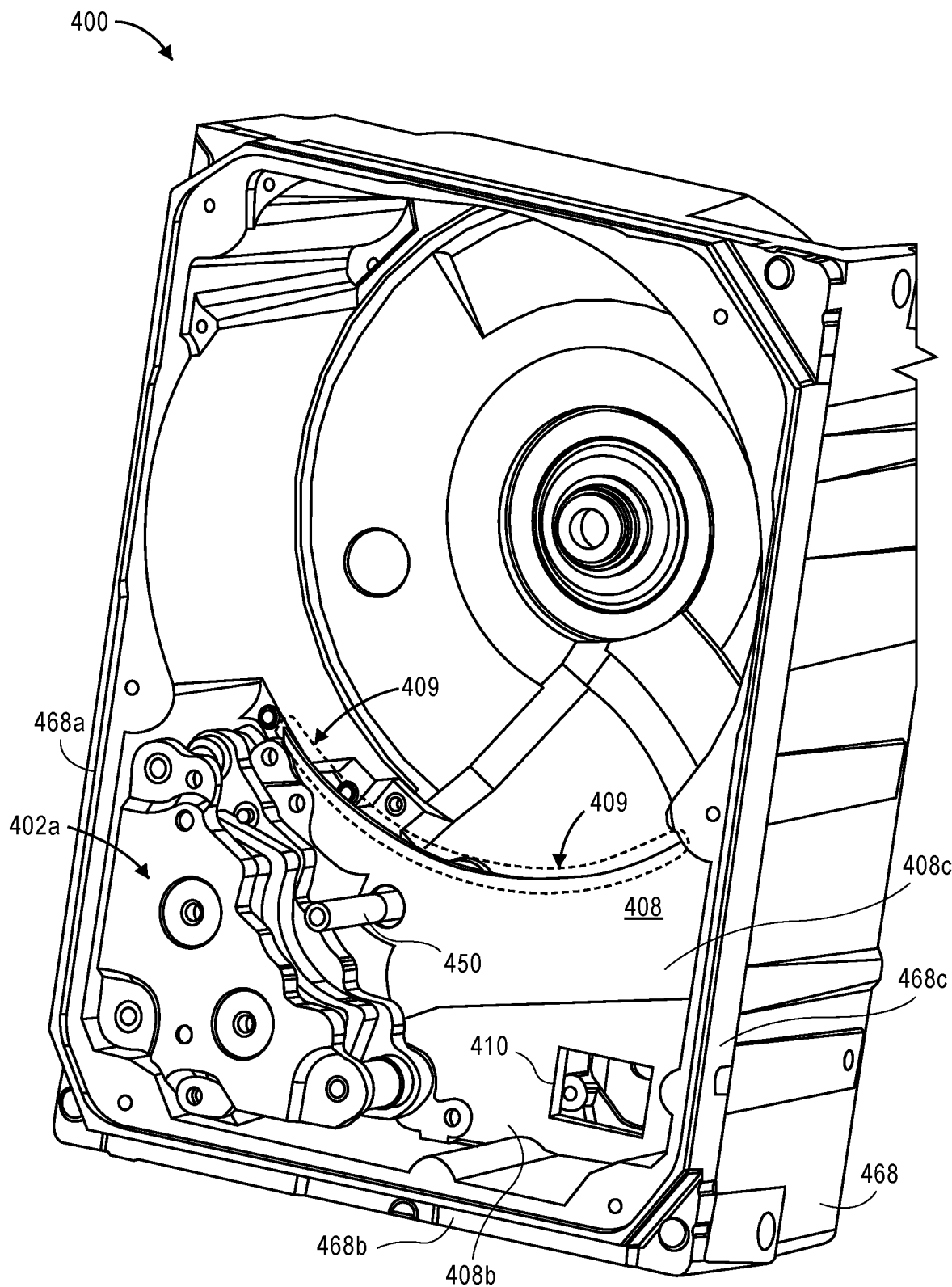
FIG. 4A is a perspective view illustrating an installed multi-actuator system with an extended stiffener plate, according to an embodiment.
Figure 4B:
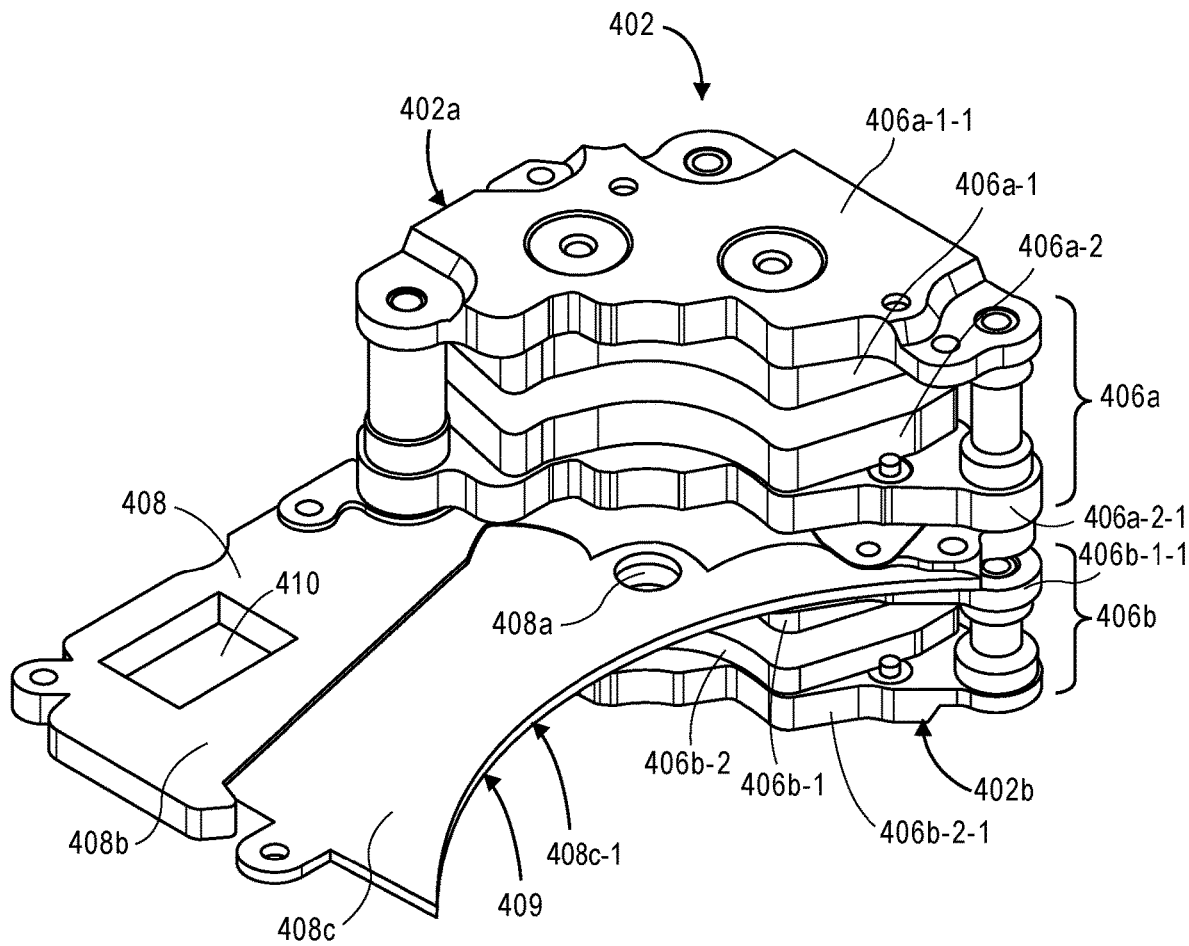
FIG. 4B is a perspective view illustrating the uninstalled multi-actuator system of FIG. 4A with actuators omitted, according to an embodiment.

FIG. 4A is a perspective view illustrating an installed multi-actuator system with a stiffener plate, and FIG. 4B is a perspective view illustrating the uninstalled multi-actuator system of FIG. 4A, with actuators omitted, both according to an embodiment. Hard disk drive (HDD) 400 comprises multi-actuator system 402 comprising two (for purposes of a non-limiting example) independent actuator systems 402a, 402b, where the coils (see, e.g., voice coil 140 of FIG. 1), carriages (see, e.g., carriage 134 of FIG. 1), arms (see, e.g., arm 132 of FIG. 1), HSAs (see, e.g., description corresponding to FIG. 1), HGAs (see, e.g., HGA 110 of FIG. 1), etc. are omitted here for clarity but are configured similarly as with actuator systems 202a, 202b (FIG. 2).

As with multi-actuator system 300 (FIG. 3), each actuator system 402a, 402b may comprise its own respective pivot bearing assembly (see, e.g., pivot bearing assembly 204a, 204b of FIG. 2, pivot bearing assembly 152 of FIG. 1), and is physically separate from the other actuator system. Each actuator system 402a, 402b also comprises its own voice coil motor assembly (VCMA) 406a, 406b, which each comprises at least one magnet 406a-1, 406a-2, 406b-1, 406b-2 coupled with a respective magnet housing plate 406a-1-1, 406a-2-1, 406b-1-1, 406b-2-1, where a respective voice coil of each actuator (not shown here; see, e.g., voice coil 140 of FIG. 1) is positioned between the corresponding magnets 406a-1, 406a-2, 406b-1, 406b-2 to form a voice coil motor/actuator. The two actuator systems 402a, 402b are stacked on top of each other in a modular fashion, with each of two pivot shafts (not shown here; see, e.g., pivot shaft 205a, 205b of FIG. 2, pivot shaft 148 of FIG. 1) engaging a common post 450 that is preferably integrated with an enclosure base 468 (e.g., HDD housing 168 of FIG. 1; may also be referred to at times as "baseplate" or "base casting" or "Motor Base Assembly" (MBA)).

Multi-actuator system 402 further comprises a stiffener plate 408 fastened to the enclosure base 468 and positioned between the upper (e.g., "first") VCMA 406a and the lower (e.g., "second") VCMA 406b, e.g., centered between the two VCMAs 406a, 406b. Notably, here the stiffener plate 408 extends beyond the pivot (e.g., represented here by post 450 and stiffener plate hole 408a) at least to an area 409 immediately adjacent to a plurality of disk media (disks omitted here for clarity; see, e.g., disk medium 120 of FIG. 1), also referred to as a "disk stack". As depicted and according to an embodiment, the stiffener plate 408 comprises an arcuate edge 408c-1 configured to border a physical interface with the disk stack. Stiffener plate 408 effectively functions as a cover for the bottom VCMA 406b and as a base for the top VCMA 406a (thus, is also referred to herein as an "internal cover"), and may be optimized for high in-plane stiffness to effectively stiffen the enclosure base 468 and improve actuator dynamics. Thus, stiffener plate 408 enables multi-actuator system 402 to have similar boundary conditions as a single actuator system and, therefore, improve low frequency dynamics (shift frequency higher and with lower magnitude, such as for tilt mode) and bring the multi-actuator system 402 dynamics (e.g., frequency response function, or "FRF") more closely in line with single actuator FRF.

According to an embodiment and as depicted in FIG. 4A, stiffener plate 408 is fastened to enclosure base 468 at three or more sides of the enclosure base, shown here as side 468a, side 468b, and side 468c. Fastening stiffener plate 408 to three or more sides (e.g., sidewalls) of enclosure base 468 is non-trivial and not arbitrary, as such a structural configuration enables higher stiffness for the described functionality of the internal cover/stiffener plate 408.

Figure 4C:
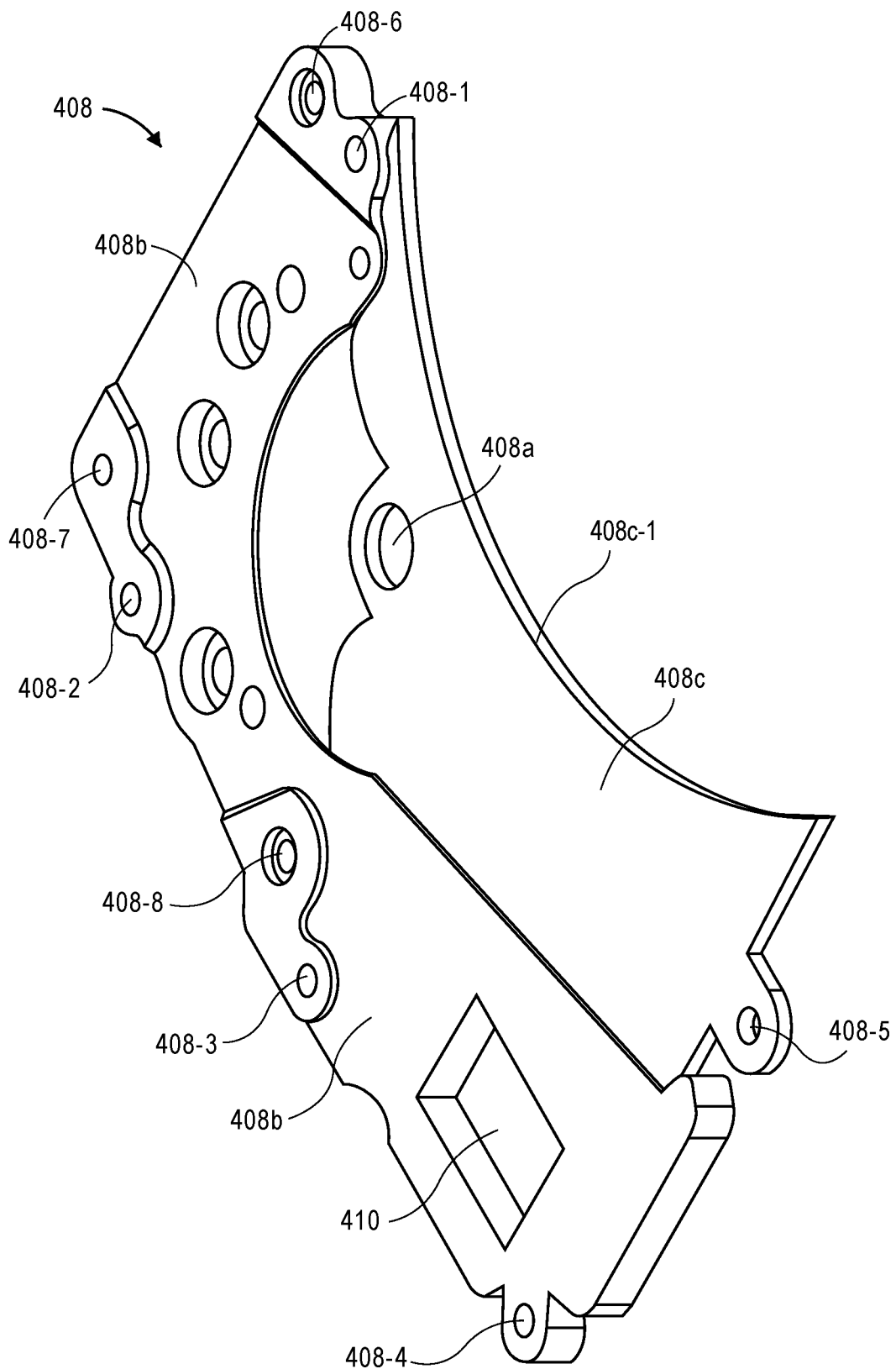
FIG. 4C is a perspective view illustrating the stiffener plate of FIG. 4A, according to an embodiment.
Figure 4D:
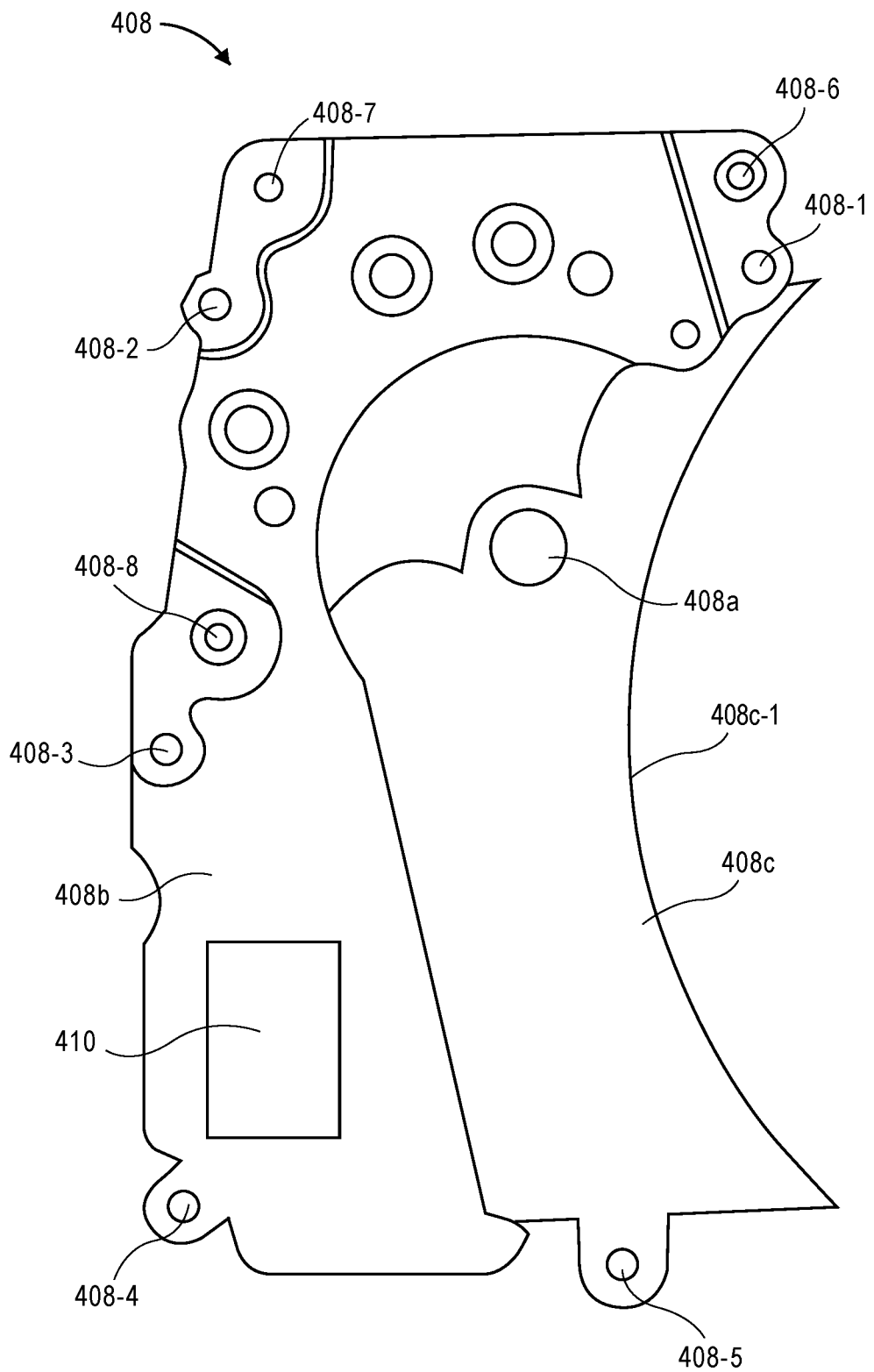
FIG. 4D is a plan view illustrating the stiffener plate of FIG. 4A, according to an embodiment.
Figure 4E:
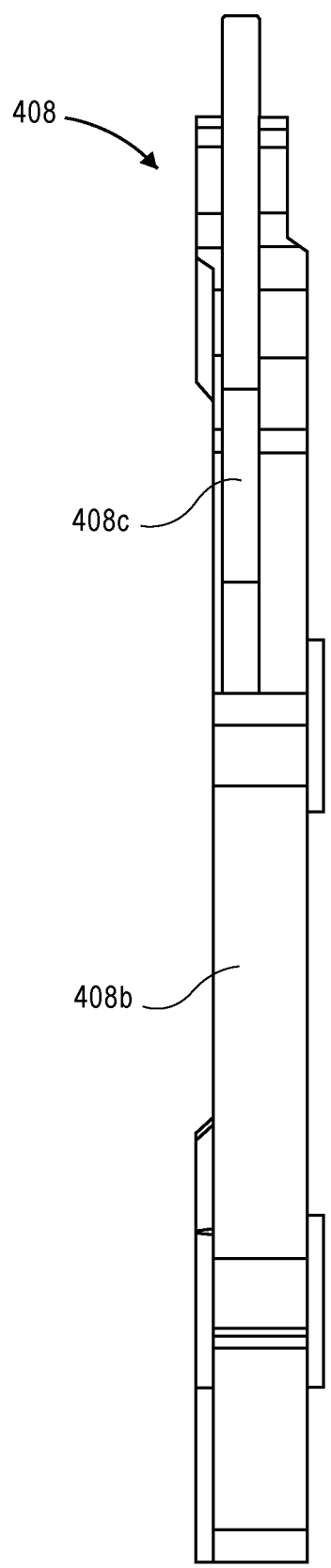
FIG. 4E is a side view illustrating the stiffener plate of FIG. 4A, according to an embodiment.
Figure 4F:
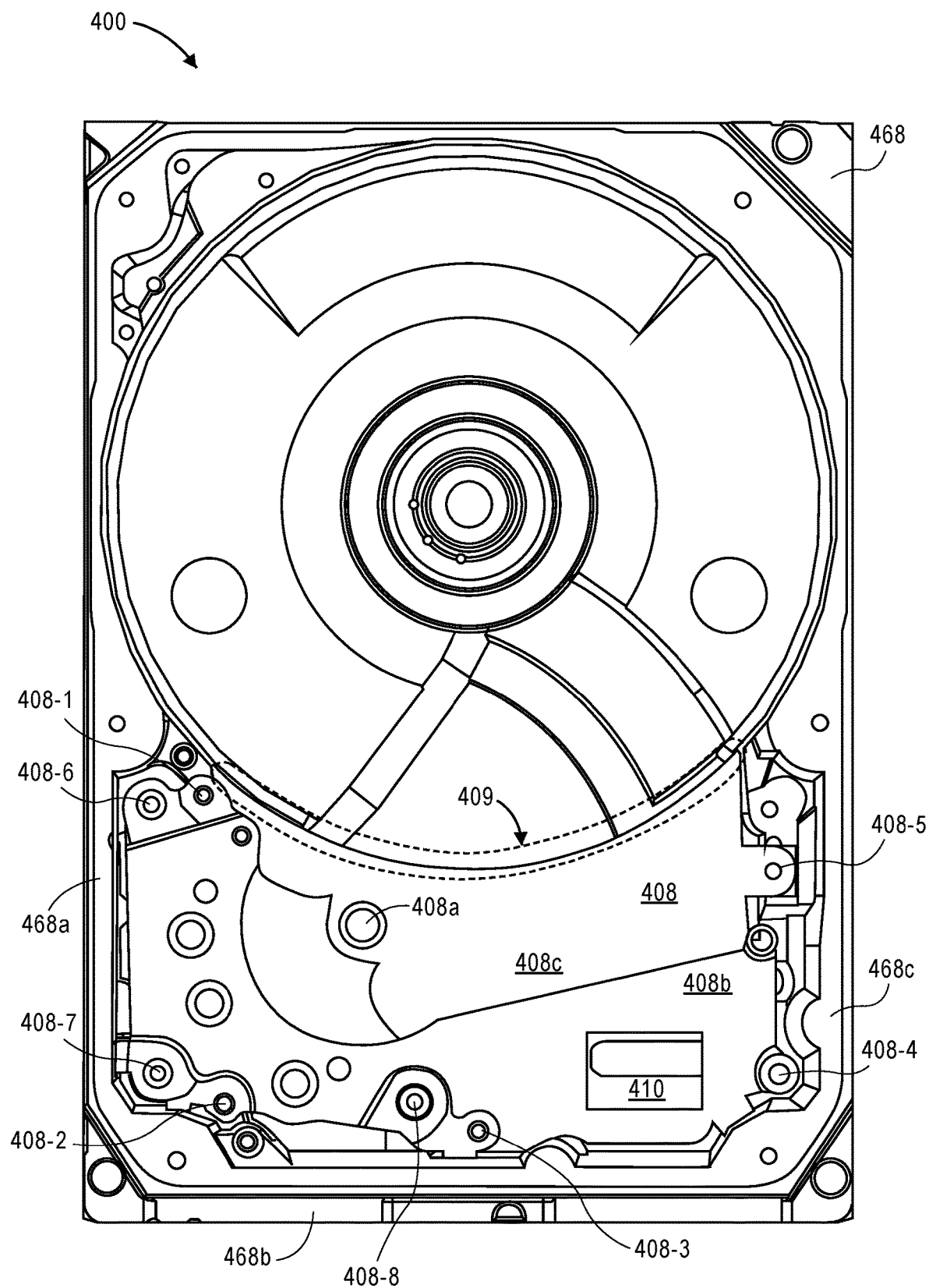
FIG. 4F is a top view illustrating the installed stiffener plate of FIG. 4A, according to an embodiment.

FIG. 4C is a perspective view illustrating the stiffener plate of FIG. 4A, FIG. 4D is a plan view illustrating the stiffener plate of FIG. 4A, and FIG. 4E is a side (end) view illustrating the stiffener plate of FIG. 4A, all according to an embodiment. Finally, FIG. 4F is a top view illustrating the installed stiffener plate of FIG. 4A, with the upper VCMA 406a omitted for clarity, according to an embodiment. According to an embodiment, stiffener plate 408 is fastened to enclosure base 468 with a fastener (e.g., a screw) at each of at least five threaded-receptacle locations of the enclosure base, shown here as example locations 408-1, 408-2, 408-3, 408-4, and 408-5. Here too, fastening stiffener plate 408 to enclosure base 468 at five or more locations is non-trivial and not arbitrary, as such a structural configuration enables higher stiffness for the described functionality of the internal cover/stiffener plate 408. Furthermore, each of the example through-holes 408-6, 408-7, 408-8 depicted in stiffener plate 408 are intended for fastening the top VCMA 406a to the stiffener plate 408, according to an embodiment.

As described in reference to FIG. 1, electrical signals are transmitted by a flexible cable assembly (FCA) such as FCA 156 (FIG. 1) between various electronic components constituent to an HDD such as HDD 400. Thus, to enable the transmission of signals between the upper electronic components positioned above stiffener plate 408 and lower electronic components below stiffener plate 408, according to an embodiment the stiffener plate 408 further comprises a cutout 410 through which the FCA is routed through the stiffener plate 408.

As can be generally recognized from FIGS. 4B, 4C, 4E, according to an embodiment the stiffener plate 408 has varying thicknesses. For example, the main body portion 408b to which the upper VCMA 406a is fastened may be thicker and thus stiffer than the extending portion 408c which extends beyond the pivot 408a area to the disk stack area 409 (FIGS. 4A, 4F). Furthermore, the thickness of the extending portion 408c may be appropriately tuned or optimized consistent with the space between adjacent disk media 120 (FIG. 1) serviced by each respective actuator system 402a, 402b, so as to not adversely affect the airflow around the outer edge of the disk media for a non-limiting example.

Figure 5A:
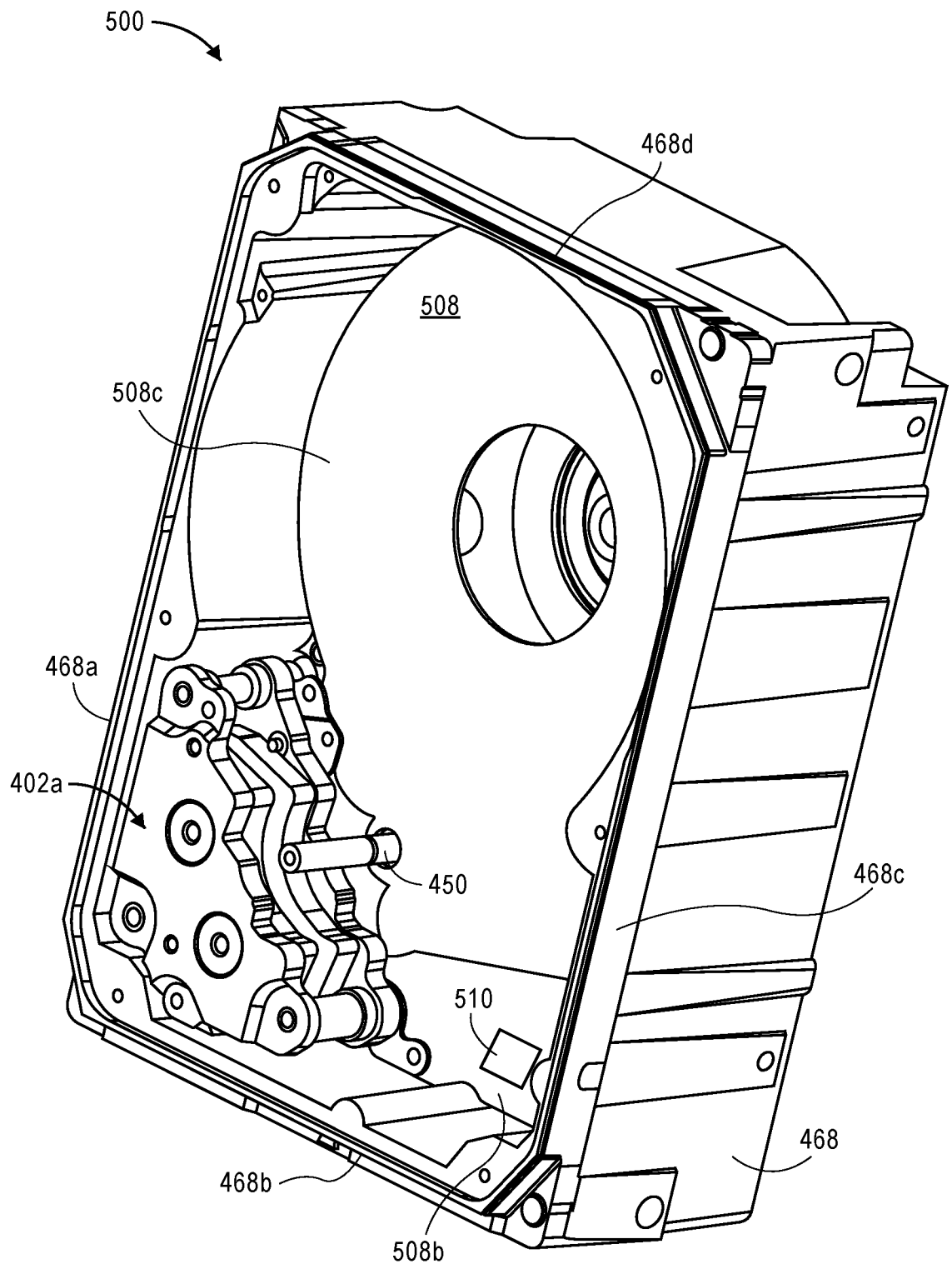
FIG. 5A is a perspective view illustrating an installed multi-actuator system with a disk-covering stiffener plate, according to an embodiment.
Figure 5B:
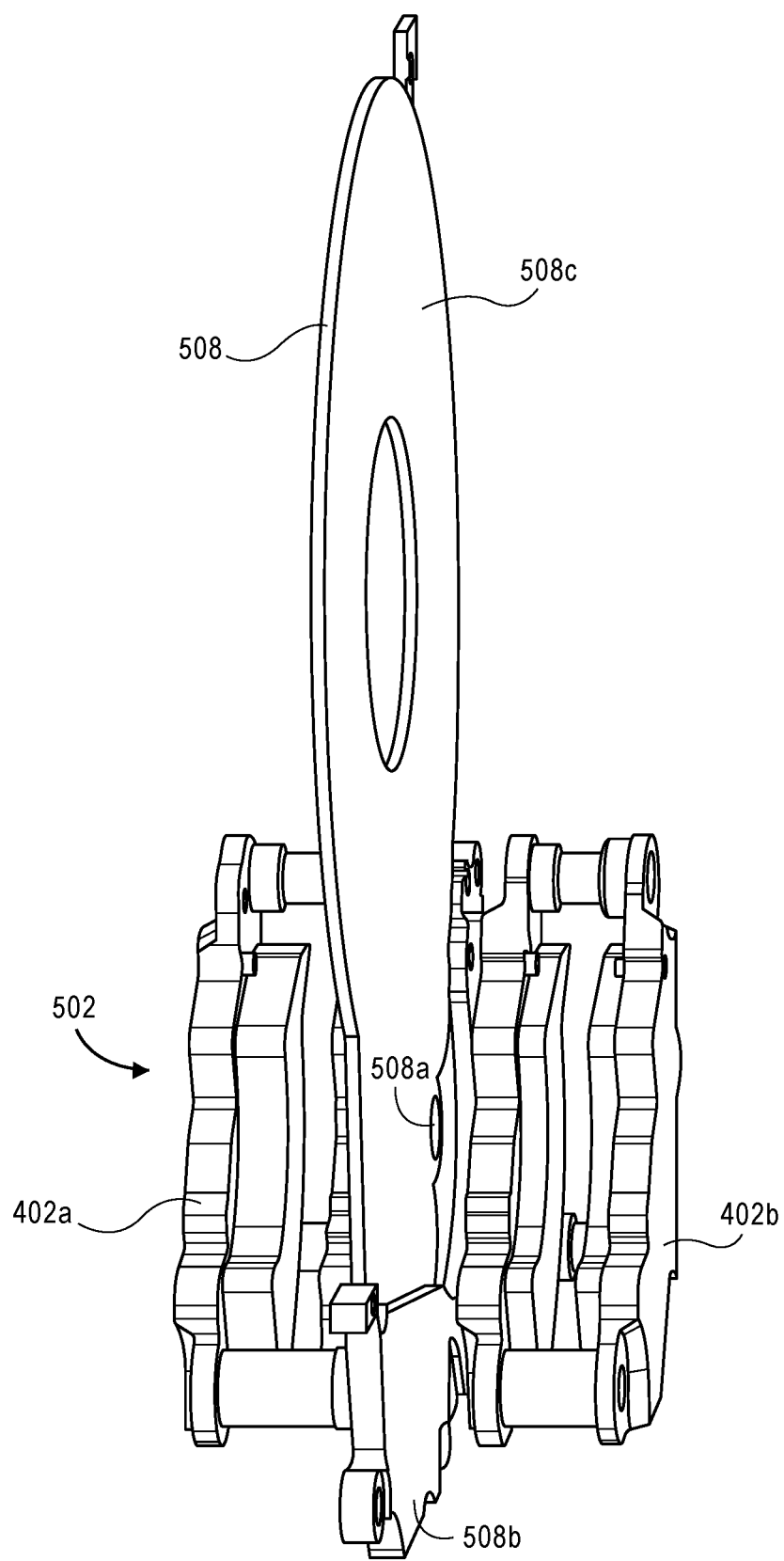
FIG. 5B is a perspective view illustrating the uninstalled multi-actuator system of FIG. 5A, according to an embodiment.

FIG. 5A is a perspective view illustrating an installed multi-actuator system with a disk-covering stiffener plate, and FIG. 5B is a perspective view illustrating the uninstalled multi-actuator system of FIG. 5A, with actuators omitted, both according to an embodiment. Hard disk drive (HDD) 500 comprises multi-actuator system 502 comprising two (for purposes of a non-limiting example) independent actuator systems 402a, 402b, where the coils (see, e.g., voice coil 140 of FIG. 1), carriages (see, e.g., carriage 134 of FIG. 1), arms (see, e.g., arm 132 of FIG. 1), HSAs (see, e.g., description corresponding to FIG. 1), HGAs (see, e.g., HGA 110 of FIG. 1), etc. are omitted here for clarity but are configured similarly as with actuator systems 202a, 202b (FIG. 2). Refer to the description of actuator systems 402a, 402b in reference to FIGS. 4A-4B. Thus, multi-actuator system 502 is largely similar to or the same as multi-actuator system 402 (FIG. 4B) except that stiffener plate 508 is used instead of stiffener plate 408 (FIGS. 4A-4F).

Multi-actuator system 502 further comprises a stiffener plate 508 fastened to the enclosure base 468 and positioned between the upper (e.g., "first") VCMA 406a and the lower (e.g., "second") VCMA 406b. Here also the stiffener plate 508 extends beyond the pivot (e.g., represented here by post 450 and stiffener plate hole 508a) at least to an area 409 (see, e.g., FIGS. 4A, 4F) immediately adjacent to a plurality of disk media (disks omitted here for clarity; see, e.g., disk medium 120 of FIG. 1). According to an embodiment, stiffener plate 508 is further positioned over the plurality of disk media, such as in the form of an annular portion 508c positioned over 360 degrees of the disk stack, as depicted. Stiffener plate 508 effectively functions as a cover for the bottom VCMA 406b and as a base for the top VCMA 406a (thus, is also referred to herein as an "internal cover"), and may be optimized for high in-plane stiffness to effectively stiffen the enclosure base 468 and improve actuator dynamics. Thus, stiffener plate 508 enables multi-actuator system 502 to have similar boundary conditions as a single actuator system and, therefore, improve low frequency dynamics (shift frequency higher and with lower magnitude, such as for tilt mode) and bring the multi-actuator system 502 dynamics (e.g., frequency response function, FRF) more closely in line with single actuator FRF.

According to an embodiment and as depicted in FIG. 5A, stiffener plate 508 is fastened to enclosure base 468 at four sides of the enclosure base, shown here as side 468a, side 468b, side 468c, side 468d. Fastening stiffener plate 508 to all four sides (e.g., sidewalls) of enclosure base 468 is non-trivial and not arbitrary, as such a structural configuration enables higher stiffness for the described functionality of the internal cover/stiffener plate 508.

Figure 5C:
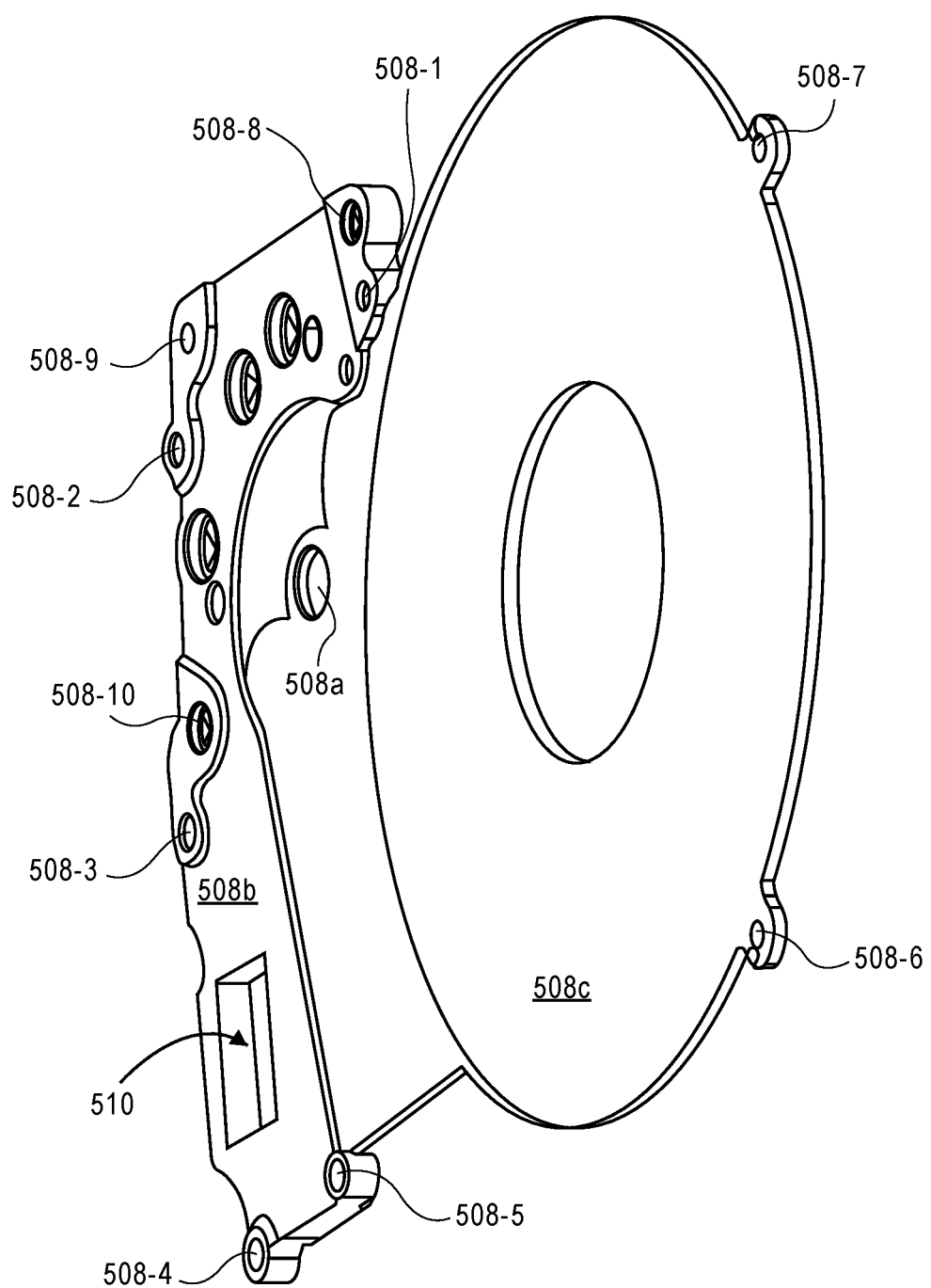
FIG. 5C is a perspective view illustrating the stiffener plate of FIG. 5A, according to an embodiment.
Figure 5D:
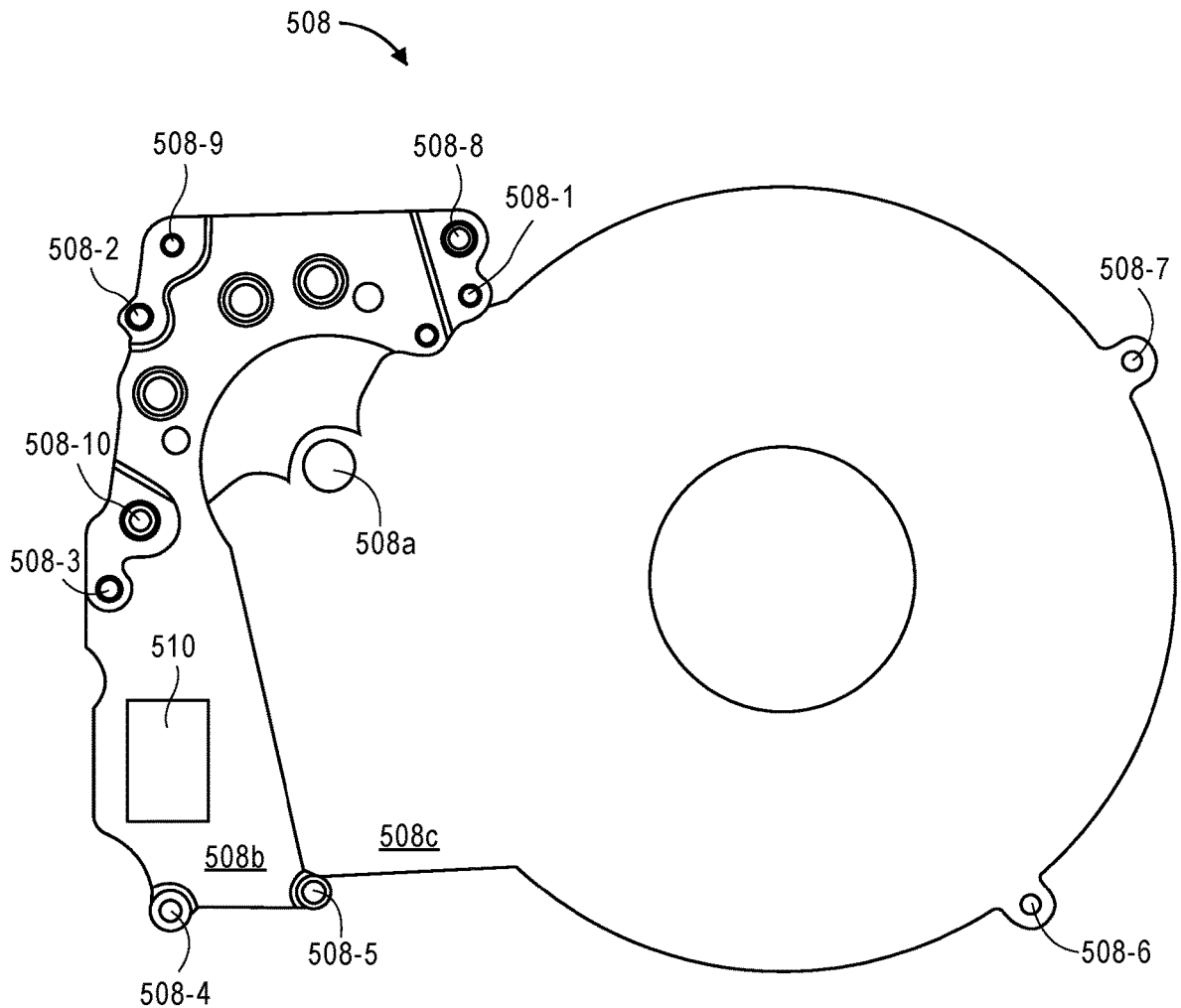
FIG. 5D is a plan view illustrating the stiffener plate of FIG. 5A, according to an embodiment.
Figure 5E:
FIG. 5E is a side view illustrating the stiffener plate of FIG. 5A, according to an embodiment.
Figure 5F:
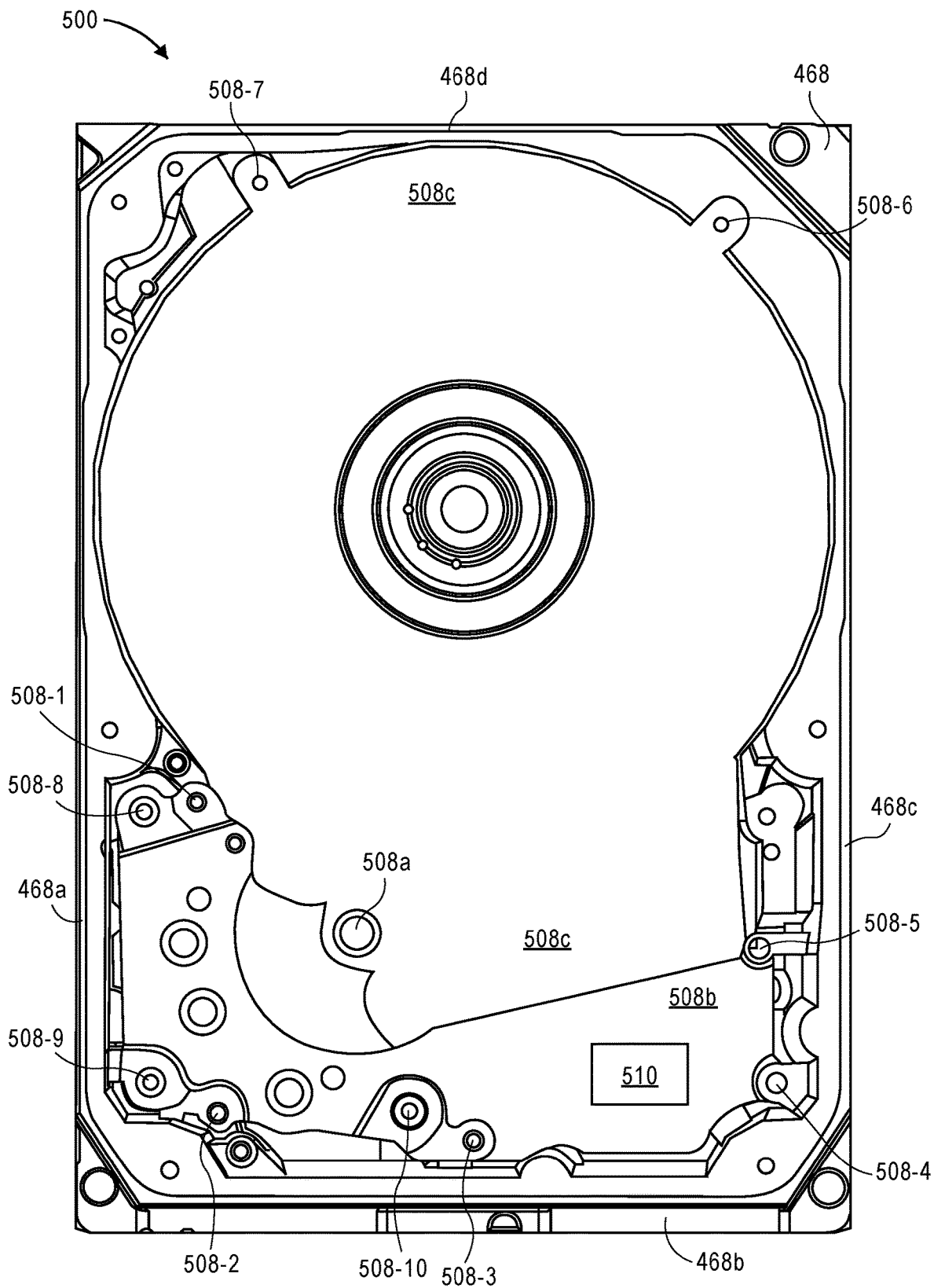
FIG. 5F is a top view illustrating the installed stiffener plate of FIG. 5A, according to an embodiment.

FIG. 5C is a perspective view illustrating the stiffener plate of FIG. 5A, FIG. 5D is a plan view illustrating the stiffener plate of FIG. 5A, and FIG. 5E is a side view illustrating the stiffener plate of FIG. 5A, all according to an embodiment. Finally, FIG. 5F is a top view illustrating the installed stiffener plate of FIG. 5A, with the upper VCMA 406a omitted for clarity, according to an embodiment.

According to an embodiment, stiffener plate 508 is fastened to enclosure base 468 with a fastener (e.g., a screw) at each of at least seven threaded-receptacle locations of the enclosure base, shown here as example locations 508-1, 508-2, 508-3, 508-4, 508-5, 508-6, and 508-7. Here too, fastening stiffener plate 508 to enclosure base 468 at seven or more locations is non-trivial and not arbitrary, as such a structural configuration enables higher stiffness for the described functionality of the internal cover/stiffener plate 508. Furthermore, each of the example through-holes 508-8, 508-9, 508-10 depicted in stiffener plate 508 are intended for fastening the top VCMA 406a to the stiffener plate 508, according to an embodiment. Here also, to enable the transmission of signals between the upper electronic components positioned above stiffener plate 508 and lower electronic components below stiffener plate 508, according to an embodiment the stiffener plate 508 further comprises a cutout 510 through which the FCA is routed through the stiffener plate 508.

As can be generally recognized from FIGS. 5B, 5C, 5E, according to an embodiment the stiffener plate 408 has varying thicknesses. For example, the main body portion 508*b* to which the upper VCMA 406*a* is fastened may be thicker and thus stiffer than the annular portion 508*c* which extends beyond the pivot 508*a* area and over the disk stack area. Furthermore, the gap and the shape of annular portion 508*c* around disk spacer area (near spindle) may be appropriately tuned or optimized to mitigate or minimize split layer fluid induced vibration (FIV) (or flow induced vibration) associated with the disk media, to function similar to a damper plate for a non-limiting example. Further to that point, the center cutout of stiffener plate 508 may be shaped other than a circle as depicted if beneficial to mitigating FIV.

Figure 5G:
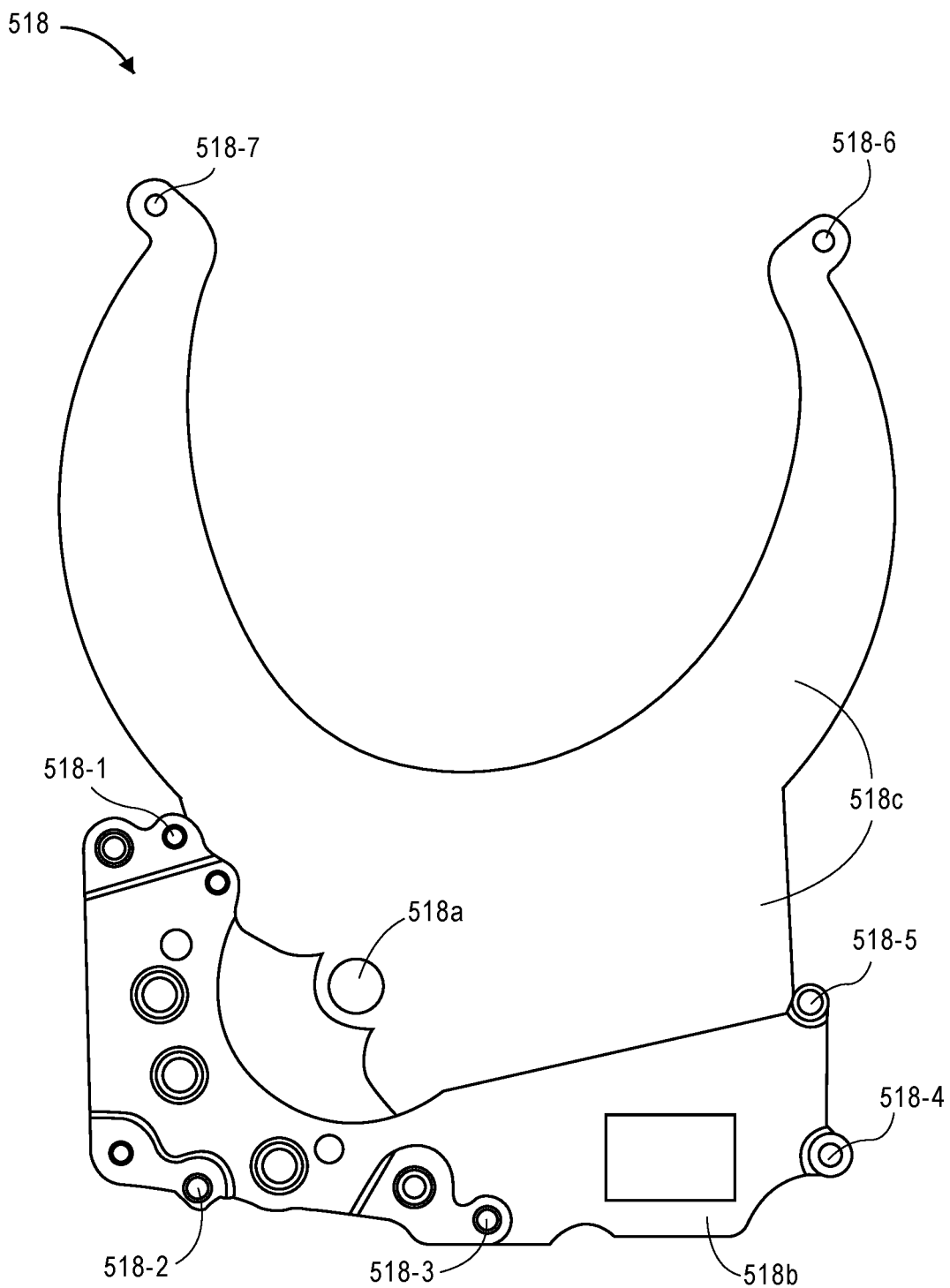
FIG. 5G is a perspective view illustrating a limited disk-covering stiffener plate, according to an embodiment.

According to an embodiment, while stiffener plate 508 is positioned over the plurality of disk media in the form of an annular portion positioned over 360 degrees of the disk stack, as depicted in FIGS. 5A-5F, a largely similar stiffener plate may be positioned over the plurality of disk media in the form of an annular portion positioned over less than 360 degrees of the disk stack. FIG. 5G is a perspective view illustrating a limited disk-covering stiffener plate, according to an embodiment. Here, a multi-actuator system such as multi-actuator system 502 (see, e.g., FIG. 5B) comprises a stiffener plate 518 fastened to the enclosure base 468 and positioned between the upper (e.g., "first") VCMA 406*a* and the lower (e.g., "second") VCMA 406*b*, and which extends beyond the pivot (e.g., represented by post stiffener plate hole 518*a*) at least to an area 409 (see, e.g., FIGS. 4A, 4F) immediately adjacent to a plurality of disk media. According to an embodiment, stiffener plate 518 is positioned partially over the plurality of disk media, such as in the form of an annular portion 518*c* positioned over less than 360 degrees of the disk stack, as depicted. Here, stiffener plate 518 is largely similar to stiffener plate 508 (see FIGS. 5A-5F and corresponding description) except that stiffener plate 518 is not configured to cover as much of the disk stack. Here also, the main body portion 518*b* to which the upper VCMA 406*a* is fastened may be thicker and thus stiffer than the annular portion 518*c* which extends beyond the pivot 518*a* area and over the disk stack area. According to an embodiment, stiffener plate 518 is fastened to enclosure base 468 (see, e.g., FIG. 5F) with a fastener at each of at least seven threaded-receptacle locations of the enclosure base, shown here as example locations 518-1, 518-2, 518-3, 518-4, 518-5, 518-6, and 518-7.

Assembling a Multi-Actuator Assembly in a Hard Disk Drive

FIG. 6 is a flowchart illustrating a method of assembling a multi-actuator assembly in a hard disk drive, according to an embodiment.

At block 602, position within an enclosure base of a hard disk drive and around a pivot, a lower rotary actuator comprising a lower voice coil motor assembly (VCMA). For example, lower (also "bottom" or "second") actuator system 402*b* (FIG. 4B) (including VCMA 406*b* (FIG. 4B) and constituent one or more magnet 406*b*-1, 406*b*-2 (FIG. 4B) coupled with a respective magnet housing plate 406*b*-1-1, 406*b*-2-1 (FIG. 4B), as well as the constituent pivot shaft for engaging the post 450 (FIG. 4A), and a corresponding carriage, set of arms, and set of HGAs) is positioned within enclosure base 468 (FIGS. 4A, 4F) of a hard disk drive (see, e.g., conventional HDD 100 of FIG. 1).

At block 604, position a stiffener plate onto the lower VCMA, wherein the stiffener plate extends beyond the pivot at least to an area immediately adjacent to a disk media stack. For example, centerplate 408 (FIGS. 4A-4F), 508 (FIGS. 5A-5F), 518 (FIG. 5G) is positioned within enclosure base 468, such as onto the magnet housing plate 406*b*-1-1 of the lower VCMA 406*b*. In the case of stiffener plate 408, positioning includes positioning the arcuate edge 408*c*-1 (FIGS. 4B-4D) of the stiffener plate 408 at or near the physical interface area 409 (FIGS. 4A, 4B, 4F) with the disk stack. Likewise, in the case of stiffener plate 508, 518, positioning includes positioning the respective annular portion 508*c*, 518*c* of the stiffener plate 508, 518 over a bottom disk stack (e.g., if two separate disk stacks and/or spindle motors are implemented) or a bottom portion of a disk stack. In the case of stiffener plate 508, 518, a top disk stack (e.g., if two separate disk stacks and/or spindle motors are implemented) or a top portion of a disk stack (e.g., the top grouping of disks) is positioned over stiffener plate 508 518 subsequent to positioning the stiffener plate 508, 518 onto the lower VCMA at block 604.

At block 606, position onto the stiffener plate and around the pivot an upper rotary actuator comprising an upper voice coil motor assembly (VCMA). For example, upper (or "top" or "first") actuator system 402*a* (FIG. 4B) (including VCMA 406*a* (FIG. 4B) and constituent one or more magnet 406*a*-1, 406*a*-2 (FIG. 4B) coupled with a respective magnet housing plate 406*a*-1-1, 406*a*-2-1 (FIG. 4B), as well as the constituent pivot shaft for engaging the post 450, and a corresponding carriage, set of arms, and set of HGAs) is positioned within enclosure base 468 and onto the stiffener plate 408, 508, 518. A flexible cable assembly may also be routed through a respective cutout 410, 510 of the stiffener plate 408, 508, 518.

At block 608, attach the stiffener plate to the enclosure base by inserting a respective fastener at each of one or more locations. For example, stiffener plate 408, 508, 518 is directly attached to enclosure base 468 by inserting a mechanical fastener such as a screw at each of one or more locations, such as at plate attachment locations 408-1 through 408-5 (FIG. 4C-4D, 4F) or 508-1 through 508-7 (FIGS. 5C-5D, 5F). According to an embodiment, the upper VCMA 406*a* is fastened to the stiffener plate 408, 508, 518 at one or more locations such as the VCMA attachment locations 408-6 through 408-8 (FIG. 4C-4D, 4F) or 508-8 through 508-10 (FIGS. 5C-5D, 5F), thereby providing an incrementally stiffer interface between the multiple actuator systems 402*a*, 402*b*. Note that those locations can be fastened any time after block 606 as they are still accessible even after the upper actuator system 402*a* is positioned onto the stiffener plate 408, 508, 518. Attaching the stiffener plate may include fastening the stiffener plate 408, 508, 518 to the enclosure base 468 at multiple sides of the enclosure base 468, e.g., sides 468*a*-468*c*, 468*d*. Similarly, attaching the stiffener plate may include fastening the stiffener plate 408, 508, 518 to the enclosure base 468 with a screw at each of at least five threaded-hole receptacles of the enclosure base 468, e.g., locations 408-1 through 408-5, 508-1 through 508-7.

Use of an extended central support structure/stiffener plate provides a stiff interface between the multiple actuator assemblies of the multi-actuator system, and effectively provides similar boundary conditions as for a single actuator configuration, which is expected to mitigate adverse effects of structural dynamics of and coupling between the actuator assemblies by improving low frequency dynamics. In particular, use of stiffener plates 408, 508, 518 shows a much cleaner direct VCM transfer function with a clear butterfly mode (BF1) peak and a phase roll-off at BF1 that is also clean and continuous. Use of stiffener plates 408, 508, 518 also leads to significant reduction in coupled VCM transfer function gain at low frequencies compared to the conventional design (see, e.g., multi-actuator assembly 300 of FIG. 3).

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD and likewise a multi-actuator HDD typically operates.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120, but commonly multiple recording media 120, rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations. The HSA is configured to mechanically interact with a load/unload (LUL) ramp 190 to move the head stack assembly (HSA), including the read-write head sliders, away from and off the disks and to safely position them onto the supporting structure of the LUL ramp.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable", or "flexible printed circuit" (FPC)). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Extensions and Alternatives

While embodiments, techniques and approaches are described herein throughout in the context of a dual-actuator system, it is contemplated and one can appreciate that these embodiments, techniques and approaches may be similarly applied to and implemented in multi-actuator systems, generally. That is, the number of actuators or actuator assemblies in a multi-actuator system in which the described embodiments, techniques and approaches may be implemented is not limited to two.

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A data storage device comprising:
a plurality of disk media rotatably mounted on a spindle;
a first head slider comprising a read-write head configured to write to and to read from a first disk medium of the plurality of disk media;
a first rotary actuator configured to move the first head slider about a pivot to access portions of the first disk medium via actuation by a first voice coil motor assembly (VCMA);
a second head slider comprising a read-write head configured to write to and to read from a second disk medium of the plurality of disk media;
a second rotary actuator configured to move the second head slider about the pivot to access portions of the second disk medium via actuation by a second voice coil motor assembly (VCMA);
an enclosure base; and
a stiffener plate fastened to the enclosure base and positioned between the first VCMA and the second VCMA, the stiffener plate extending beyond the pivot at least to an area immediately adjacent to the plurality of disk media.

2. The data storage device of claim 1, wherein the stiffener plate is fastened to the enclosure base at three or more sides of the enclosure base.

3. The data storage device of claim 1, wherein the stiffener plate is fastened to the enclosure base with a screw at each of at least five threaded-receptacle locations of the enclosure base.

4. The data storage device of claim 1, further comprising:
a flexible cable assembly;
wherein the stiffener plate comprises a cutout through which the flexible cable assembly is routed.

5. The data storage device of claim 1, wherein the stiffener plate comprises an arcuate edge configured to border an interface with the plurality of disk media.

6. The data storage device of claim 1, wherein the stiffener plate is positioned over a disk medium of the plurality of disk media.

7. The data storage device of claim 6, wherein the stiffener plate is fastened to the enclosure base at all four sides of the enclosure base.

8. The data storage device of claim 6, wherein the stiffener plate comprises an annular portion positioned over 360 degrees of a disk medium of the plurality of disk media.

9. The data storage device of claim 6, wherein the stiffener plate comprises an annular portion positioned over a portion of a disk medium of the plurality of disk media less than 360 degrees.

10. The data storage device of claim 1, wherein the enclosure base has a height greater than one inch for enclosing the first and second rotary actuators.

11. A method of assembling a multi-actuator assembly in a hard disk drive, the method comprising:
positioning, within an enclosure base of the hard disk drive and around a pivot, a lower rotary actuator comprising a lower voice coil motor assembly (VCMA);
positioning a stiffener plate onto the lower VCMA, wherein the stiffener plate extends beyond the pivot at least to an area immediately adjacent to a disk media stack;
positioning, onto the stiffener plate and around the pivot, an upper rotary actuator comprising an upper voice coil motor assembly (VCMA); and
attaching the stiffener plate to the enclosure base by inserting a respective fastener at each of a plurality of locations.

12. The method of claim 11, wherein attaching the stiffener plate includes fastening the stiffener plate to the enclosure base at three or more sides of the enclosure base.

13. The method of claim 11, wherein attaching the stiffener plate includes fastening the stiffener plate to the enclosure base with a screw at each of at least five threaded-receptacle locations of the enclosure base.

14. The method of claim 11, further comprising:
routing a flexible cable assembly through a cutout of the stiffener plate.

15. The method of claim 11, wherein positioning the stiffener plate includes positioning the stiffener plate over a disk medium of a plurality of disk media of the hard disk drive.

16. The method of claim 15, wherein attaching the stiffener plate includes fastening the stiffener plate to the enclosure base at all sides of the enclosure base.

17. A multi-actuator hard disk drive (HDD) comprising:
a plurality of disk media rotatably mounted on a spindle;
a multi-actuator system comprising:
   a first plurality of head sliders each housing a read-write transducer configured to read from and to write to at least one disk medium of the plurality of disk media;
   first means for moving the first plurality of head sliders to access portions of the plurality of disk media;
   a second plurality of head sliders each housing a read-write transducer configured to read from and to write to at least one disk medium of the plurality of disk media; and
   second means for moving the second plurality of head sliders to access portions of the plurality of disk media;
an enclosure base; and
mechanically attached to the enclosure base at three or more sides of the enclosure base, means for stiffening the multi-actuator system at an interface of the first means for moving the first plurality of head sliders and the second means for moving the second plurality of head sliders to restrict tilting and/or rocking motion of the first and second means for moving the first and second pluralities of head sliders, wherein the means for stiffening extends at least to an area immediately adjacent to the plurality of disk media.

18. The multi-actuator HDD of claim 17, further comprising:
a flexible cable assembly;
wherein the means for stiffening comprises an orifice through which the flexible cable assembly is routed.

19. The multi-actuator HDD of claim 17, wherein the means for stiffening comprises an arcuate edge configured to border an interface with the plurality of disk media.

20. The multi-actuator HDD of claim 17, wherein:
the means for stiffening extends over a disk medium of the plurality of disk media; and
the means for stiffening is fastened to the enclosure base at four sides of the enclosure base.

* * * * *